(12) United States Patent
Song et al.

(10) Patent No.: US 11,842,424 B2
(45) Date of Patent: Dec. 12, 2023

(54) IMAGE SENSING DEVICE AND OPERATING METHOD THEREOF

(71) Applicant: SK hynix Inc., Gyeonggi-do (KR)

(72) Inventors: Jeong Eun Song, Gyeonggi-do (KR); Yu Jin Park, Gyeonggi-do (KR); Min Seok Shin, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 546 days.

(21) Appl. No.: 17/077,695

(22) Filed: Oct. 22, 2020

(65) Prior Publication Data

US 2021/0358077 A1 Nov. 18, 2021

(30) Foreign Application Priority Data

May 15, 2020 (KR) .......................... 10-2020-0058462

(51) Int. Cl.
*G06T 1/60* (2006.01)
*G06T 1/20* (2006.01)
(Continued)

(52) U.S. Cl.
CPC .............. *G06T 1/60* (2013.01); *G01B 11/022* (2013.01); *G01S 17/00* (2013.01); *G06T 1/20* (2013.01); *G11C 5/147* (2013.01); *G11C 7/106* (2013.01); *G11C 7/1057* (2013.01); *G11C 27/028* (2013.01); *G01S 7/484* (2013.01); *G01S 7/4816* (2013.01)

(58) Field of Classification Search
CPC ......... G06T 1/60; G01B 11/022; G01S 17/00; G01S 7/4816; G01S 7/484; G11C 5/147; G11C 7/106; G11C 27/028; H03M 1/56; H03M 1/18; H04N 25/75; H04N 25/76; H04N 25/766; H04N 25/77
See application file for complete search history.

(56) References Cited

U.S. PATENT DOCUMENTS 7,012,557 B2 * 3/2006 Takayanagi ............. H03M 1/56
341/155
8,279,311 B2 10/2012 Lim
(Continued)

FOREIGN PATENT DOCUMENTS

| CN | 110401804 A | 11/2019 |
|---|---|---|
| CN | 110418086 A | 11/2019 |
| CN | 110784669 A | 2/2020 |

OTHER PUBLICATIONS

MLX75023 Time-of-Flight Sensor Array, Product Datasheet, 2016, pp. 1-28, Melexis.
(Continued)

*Primary Examiner* — Marly S Camargo
(74) *Attorney, Agent, or Firm* — IP & T GROUP LLP

(57) ABSTRACT

Disclosed is an image sensing device including a plurality of current cells whose total number to be used is adjusted based on a plurality of enable signals, and which are sequentially controlled based on a reset signal and a plurality of selection signals; a current-voltage conversion circuit suitable for converting a plurality of unit currents, which are supplied from current cells used among the plurality of current cells, into a ramp signal; and a first control circuit suitable for generating the plurality of enable signals based on a maximum conversion code value corresponding to a slope of the ramp signal.

20 Claims, 9 Drawing Sheets

(51) Int. Cl.
*G11C 7/10* (2006.01)
*G11C 27/02* (2006.01)
*G11C 5/14* (2006.01)
*G01B 11/02* (2006.01)
*G01S 17/00* (2020.01)
*G01S 7/481* (2006.01)
*G01S 7/484* (2006.01)

(56) References Cited

U.S. PATENT DOCUMENTS

| | | | | |
|---|---|---|---|---|
| 8,659,465 | B2* | 2/2014 | Simony | H03M 1/56 |
| | | | | 341/169 |
| 9,325,301 | B2* | 4/2016 | Lee | H04N 25/75 |
| 9,736,408 | B2* | 8/2017 | Kim | H04N 25/616 |
| 2006/0164277 | A1* | 7/2006 | Lee | H03K 4/50 |
| | | | | 341/155 |
| 2010/0208112 | A1* | 8/2010 | Lim | H04N 25/75 |
| | | | | 348/294 |
| 2015/0171841 | A1 | 6/2015 | Lee et al. | |
| 2017/0318247 | A1 | 11/2017 | Kim | |
| 2018/0123572 | A1* | 5/2018 | Song | H03K 5/12 |
| 2019/0281246 | A1 | 9/2019 | Kim | |
| 2020/0099882 | A1 | 3/2020 | Kim | |
| 2022/0078363 | A1* | 3/2022 | Kang | H04N 25/75 |
| 2022/0173745 | A1* | 6/2022 | Kim | H03M 1/1014 |

OTHER PUBLICATIONS

MLX75027 VGA Time-of-Flight Sensor, Preliminary Datasheet v0.9, 2020, pp. 1-67, Melexis.

Office Action issued for the Chinese Patent Application No. 202110053932.2 issued by the Chinese Patent Office dated Oct. 23, 2023.

* cited by examiner

IMAGE SENSING DEVICE AND OPERATING METHOD THEREOF

CROSS-REFERENCE TO RELATED APPLICATION(S)

This application claims priority under 35 U.S.C. § 119 to Korean Patent Application No. 10-2020-0058462, filed on May 15, 2020, the disclosure of which is incorporated herein by reference in its entirety.

BACKGROUND

1. Field

Various embodiments of the present disclosure relate to a semiconductor design technique, and more particularly, to an image sensing device and an operating method thereof.

2. Description of the Related Art

Image sensing devices capture images using the property of a semiconductor which reacts to light. Generally, there are two types of image sensing devices: charge-coupled device (CCD) image sensing devices and complementary metal-oxide semiconductor (CMOS) image sensing devices. Recently, CMOS image sensing devices are widely used because CMOS image sensing devices allow both analog and digital control circuits to be directly implemented on a single integrated circuit (IC).

SUMMARY

Various embodiments of the present disclosure are directed to an image sensing device that may flexibly adjust an analog to digital (A/D) conversion range according to a use environment or condition when measuring depth information by means of a time-of-flight (ToF) technology, and an operating method of the image sensing device.

In accordance with an embodiment, an image sensing device may include: a plurality of current cells whose total number to be used is adjusted based on a plurality of enable signals, and which are sequentially controlled based on a reset signal and a plurality of selection signals; a current-voltage conversion circuit suitable for converting a plurality of unit currents, which are supplied from current cells used among the plurality of current cells, into a ramp signal; and a first control circuit suitable for generating the plurality of enable signals based on a maximum conversion code value corresponding to a slope of the ramp signal.

The maximum conversion code value may be determined according to a ratio between reflected light that is reflected from a subject and background light that is present in a periphery of the subject.

At least one current cell that is not used among the plurality of current cells may be electrically decoupled from an output terminal of the ramp signal.

Each of the plurality of current cells may include: a switch control circuit suitable for generating a switch control signal that is activated based on the reset signal, deactivated based on at least one corresponding selection signal among the plurality of selection signals, and deactivated based on a corresponding enable signal among the plurality of enable signals; and a unit current supply circuit suitable for selectively supplying the unit currents to an output terminal of the ramp signal based on the switch control signal.

The switch control circuit may include: a latch coupled between first and second nodes, and suitable for latching the switch control signal; a reset element coupled between the first node and a predetermined voltage terminal, and suitable for activating the switch control signal based on the reset signal; at least one selection element coupled between the second node and the predetermined voltage terminal, and suitable for deactivating the switch control signal based on the at least one selection signal; and a disable element coupled between the second node and the predetermined voltage terminal, and suitable for deactivating the switch control signal based on the corresponding enable signal.

The unit current supply circuit may adjust an amount of the unit currents based on a bias voltage, and a voltage level of the bias voltage may be adjusted corresponding to the maximum conversion code value.

The image sensing device may further include a second control circuit suitable for generating a bias voltage whose voltage level is adjusted based on the maximum conversion code value, and each of the plurality of current cells may adjust an amount of the unit currents based on the bias voltage.

In accordance with an embodiment, an image sensing device may include: a pixel array suitable for generating a plurality of pixel signals based on incident light; a signal converter suitable for generating a plurality of digital signals based on the plurality of pixel signals and a ramp signal; and a ramp signal generator including a plurality of current cells, and suitable for generating the ramp signal by adjusting the total number of current cells to be used among the plurality of current cells, based on a maximum conversion code value corresponding to a slope of the ramp signal and sequentially controlling the current cells to be used, based on a plurality of selection signals and a reset signal.

The maximum conversion code value may be determined according to a ratio between reflected light that is reflected from a subject and background light that is present in a periphery of the subject, the reflected light and the background light being included in the incident light.

At least one current cell which is not used among the plurality of current cells may be electrically decoupled from an output terminal of the ramp signal.

The ramp signal generator may adjust the slope of the ramp signal based on the maximum conversion code value, a swing range of the ramp signal being fixed.

The signal converter may adjust an analog to digital (A/D) conversion range according to the slope of the ramp signal, and generate the plurality of digital signals according to the A/D conversion range.

The ramp signal generator may include: the plurality of current cells whose total number to be used is adjusted based on a plurality of enable signals, and which are sequentially controlled based on the plurality of selection signals and the reset signal; a current-voltage conversion circuit suitable for converting a plurality of unit currents, which are supplied from current cells used among the plurality of current cells, into the ramp signal; and a first control circuit suitable for generating the plurality of enable signals based on the maximum conversion code value.

Each of the plurality of current cells may include: a switch control circuit suitable for generating a switch control signal that is activated based on the reset signal, deactivated based on at least one corresponding selection signal among the plurality of selection signals, and deactivated based on a corresponding enable signal among the plurality of enable signals; and a unit current supply circuit suitable for selectively supplying the unit currents to an output terminal of the ramp signal based on the switch control signal.

The switch control circuit may include: a latch coupled between first and second nodes, and suitable for latching the switch control signal; a reset element coupled between the first node and a predetermined voltage terminal, and suitable for activating the switch control signal based on the reset signal; at least one selection element coupled between the second node and the predetermined voltage terminal, and suitable for deactivating the switch control signal based on the at least one selection signal; and a disable element coupled between the second node and the predetermined voltage terminal, and suitable for deactivating the switch control signal based on the corresponding enable signal.

The unit current supply circuit may adjust an amount of the unit currents based on a bias voltage, and a voltage level of the bias voltage may be adjusted corresponding to the maximum conversion code value.

The ramp signal generator may further include a second control circuit suitable for generating a bias voltage whose voltage level is adjusted, based on the maximum conversion code value, and each of the plurality of current cells may adjust an amount of the unit currents based on the bias voltage.

In accordance with an embodiment, an operating method of an image sensing device may include: emitting emitted light to a subject; receiving background light and reflected light, which is reflected from the subject; generating a digital signal according to an analog to digital (A/D) conversion range corresponding to a slope of a ramp signal, based on the ramp signal whose slope is adjusted according to a use environment indicating a ratio between the reflected light and the background light and a pixel signal outputted from a pixel array; and measuring a depth from the subject based on the digital signal.

The ramp signal may be generated by sequentially controlling current cells to be used among a plurality of current cells.

At least one current cell which is not used among the plurality of current cells may be electrically decoupled from an output terminal of the ramp signal.

In accordance with an embodiment, an image sensing device may include: a control circuit suitable for generating a control signal whose level depends on a ratio between reflected light and background light configuring incident light; current cells each operative depending on the ratio and each suitable for generating unit current according to the control signal; and a ramp signal circuit suitable for generating a ramp signal based on the generated unit currents.

DETAILED DESCRIPTION

Various embodiments are described in detail below with reference to the accompanying drawings, in order to enable those skilled in art to which the present disclosure pertains to practice and easily carry out the present invention. Throughout the specification, reference to "an embodiment" or the like is not necessarily to only one embodiment, and different references to any such phrase are not necessarily to the same embodiment(s). The term "embodiments" when used herein does not necessarily refer to all embodiments.

Throughout the specification, when an element is referred to as being "connected to" or "coupled to" another element, the element may be directly connected to or coupled to the another element, or electrically connected to or coupled to the another element with one or more elements interposed therebetween. In addition, it will also be understood that the terms "comprises," "comprising," "includes," and "including" when used herein, specify the presence of the stated elements and do not preclude the presence or addition of one or more other elements. In the following description some components are described in the singular form, but the present disclosure is not limited thereto; it will be understood that components may be formed in plural.

Figure 1:
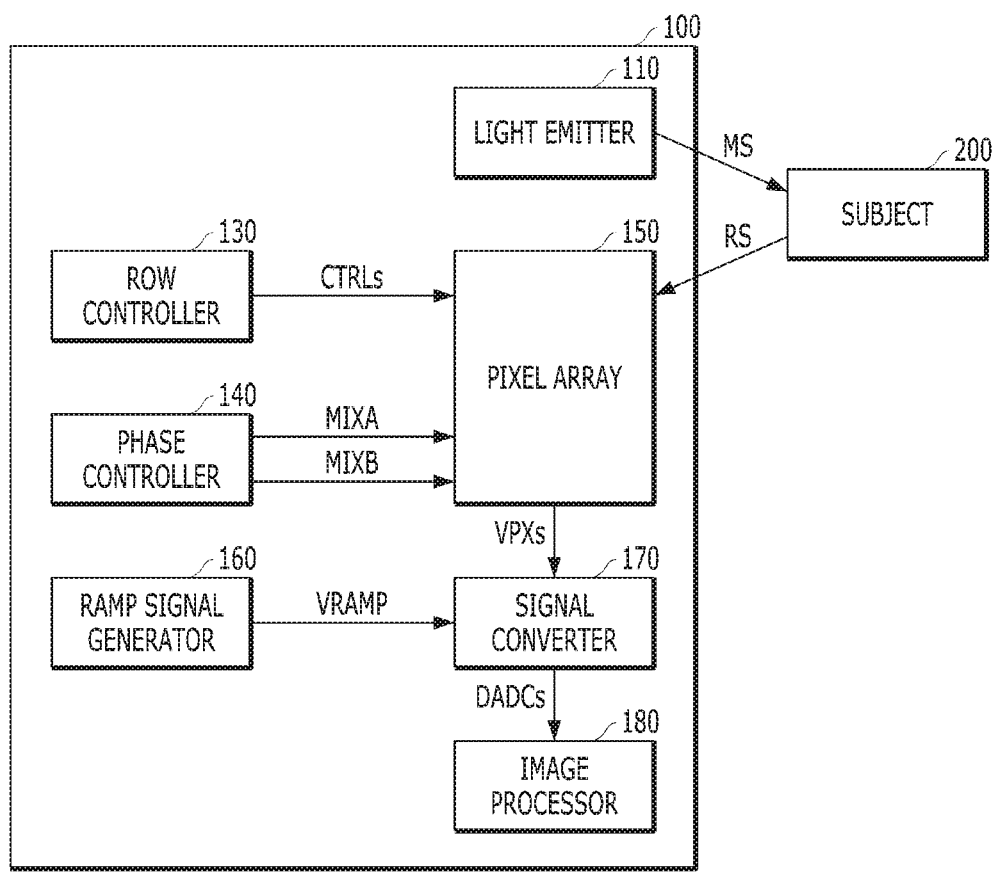
FIG. 1 is a block diagram illustrating an image sensing device in accordance with an embodiment.

FIG. 1 is a block diagram illustrating an image sensing device 100 in accordance with an embodiment.

Referring to FIG. 1, the image sensing device 100 may measure its distance, i.e., depth, from a subject 200 using a time of flight (ToF) method. For example, the image sensing device 100 may measure or calculate the depth by detecting a phase difference between emitted light MS that is emitted to the subject 200 and incident light RS that is reflected from the subject 200. For example, the image sensing device 100 may include a light emitter 110, a row controller 130, a phase controller 140, a pixel array 150, a ramp signal generator 160, a signal converter 170 and an image processor 180. The depth measurement may be embodied in, or represented by, depth information.

The light emitter 110 may output the emitted light MS to the subject 200. For example, the emitted light MS may be a periodic signal that periodically toggles. The emitted light MS may be reflected by the subject 200, and be inputted to the pixel array 150 as the incident light RS. In actuality, the incident light RS may include reflected light that is reflected by the subject 200 and background light that is present in the periphery of the subject 200.

The row controller 130 may generate a plurality of row control signals CTRLs for controlling the pixel array 150 for each row. For example, the row controller 130 may generate first row control signals for controlling pixels arranged in a first row of the pixel array 150, and generate $n^{th}$ row control signals for controlling pixels arranged in an $n^{th}$ row of the pixel array 150, where "n" is a natural number greater than 2.

The phase controller 140 may generate first and second control signals MIXA and MIXB having different phases. For example, the first and second control signals MIXA and MIXB may have a phase difference of 180 degrees. The first and second control signals MTXA and MIXB may have the same period as the emitted light MS, and any one of the first and second control signals MIXA and MIXB may have the same phase as the emitted light MS.

The pixel array 150 may generate a plurality of pixel signals VPXs based on the incident light RS, the plurality of row control signals CTRLs and the first and second control signals MIXA and MIXB. The pixel array 150 may include at least one unit pixel for measuring the depth from the subject 200. For example, the unit pixel may be selected based on the plurality of row control signals CTRLs, and generate first and second pixel signals VPX1 and VPX2 based on the first and second control signals MIXA and MIXB and the incident light RS. The unit pixel is described in more detail below with reference to FIG. 2.

The ramp signal generator 160 may generate a ramp signal VRAMP. The ramp signal generator 160 may adjust a slope of the ramp signal VRAMP according to a use environment or condition in a state where a swing range of the ramp signal VRAMP is fixed. In other words, the ramp signal generator 160 may adjust a ramping time of the ramp signal VRAMP in the same swing range according to the use environment. The ramp signal generator 160 is described in more detail below with reference to FIGS. 3 to 5.

The signal converter 170 may generate a plurality of digital signals DADCs based on the plurality of pixel signals VPXs and the ramp signal VRAMP. The signal converter 170 may adjust an analog to digital (A/D) conversion range according to the slope or ramping time of the ramp signal VRAMP, and generate the plurality of digital signals DADCs according to the A/D conversion range. For example, the signal converter 170 may include an analog-to-digital converter.

The image processor 180 may measure the depth from the subject 200, based on the plurality of digital signals DADCs. For example, the image processor 180 may measure or calculate the depth by performing a subtraction process on the first and second pixel signals VPX1 and VPX2, FIG. 2 is a circuit diagram illustrating the unit pixel illustrated in FIG. 1.

Figure 2:
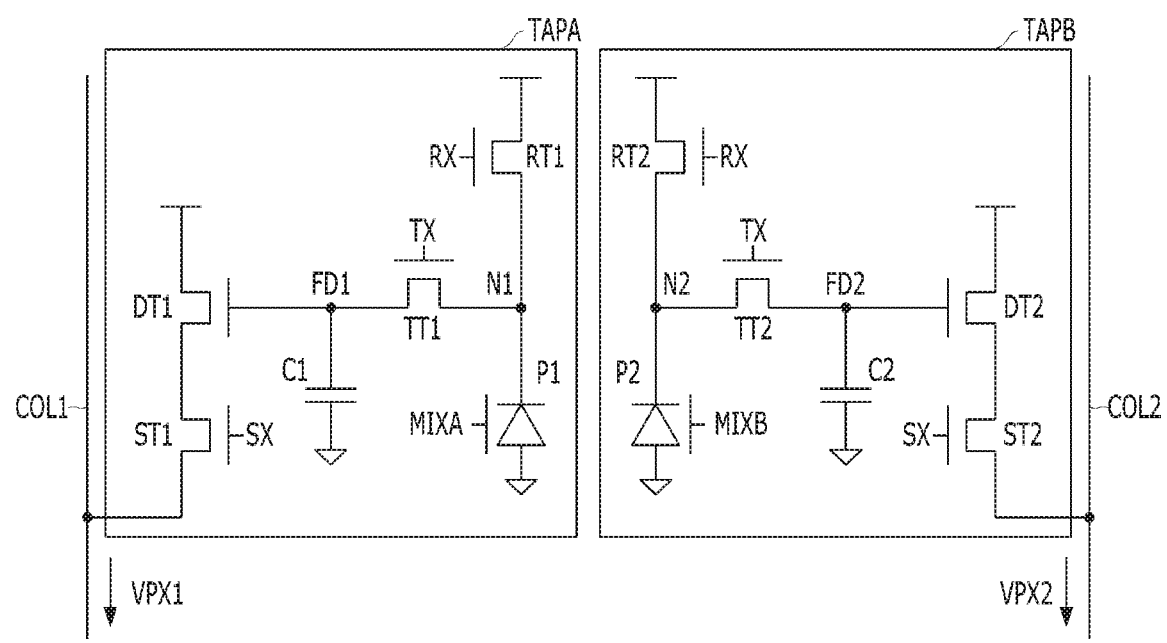
FIG. 2 is a circuit diagram illustrating a pair of pixels, such as those illustrated in FIG. 1.

Referring to FIG. 2, the unit pixel may include a pair of pixels. For example, the pair of pixels may include a first pixel TAPA and a second pixel TAPB.

The first pixel TAPA may generate the first pixel signal VPX1 based on a reset signal RX, a transmission signal TX, a selection signal SX and the first control signal MIXA. The reset signal RX, the transmission signal TX and the selection signal SX may be included in the plurality of row control signals CTRLs described above. For example, the first pixel TAPA may include a first sensing circuit P1, a first reset circuit RT1, a first transmission circuit TT1, a first charge storage circuit C1, a first driving circuit DT1 and a first selection circuit ST1.

The first sensing circuit P1 may be coupled between a first node N1 and a first low voltage terminal. The first sensing circuit P1 may generate first charges, which corresponds to the incident light RS, based on the first control signal MIXA. The first sensing circuit P1 may include a photodiode.

The first reset circuit RT1 may be coupled between a first high voltage terminal and the first node N1. The first reset circuit RT1 may reset the first sensing circuit P1 and the first charge storage circuit C1 based on the reset signal RX.

The first transmission circuit 111 may be coupled between the first node N1 and a first floating diffusion node FD1. The first transmission circuit TT1 may reset the first charge storage circuit C1 and transmit the first charges, which are generated from the first sensing circuit P1, to the first charge storage circuit C1, based on the transmission signal TX.

The first charge storage circuit C1 may be coupled between the first floating diffusion node FD1 and the first low voltage terminal. The first charge storage circuit C1 may store the first charges. For example, the first charge storage circuit C1 may be a parasitic capacitor.

The first driving circuit DT1 may be coupled between the first high voltage terminal and the first selection circuit ST1. The first driving circuit DT1 may drive a first column line COL1 with a high voltage, which is supplied through the first high voltage terminal, based on a voltage loaded on the first floating diffusion node FD1.

The first selection circuit ST1 may be coupled between the first driving circuit DT1 and the first column line COL1 The first selection circuit ST1 may selectively couple the first driving circuit DT1 to the first column line COL1 based on the selection signal SX. The first selection circuit ST1 may output the first pixel signal VPX1 through the first column line COL1.

The second pixel TAPB may generate the second pixel signal VPX2 based on a reset signal RX, a transmission signal TX, a selection signal SX and the second control signal MIXB. For example, the second pixel TAPB may include a second sensing circuit P2, a second reset circuit RT2, a second transmission circuit TT2, a second charge storage circuit C2, a second driving circuit DT2 and a second selection circuit ST2.

The second sensing circuit P2 may be coupled between a second node N2 and the first low voltage terminal. The second sensing circuit P2 may generate second charges, which corresponds to the incident light RS, based on the second control signal MIXB. The second sensing circuit P2 may include a photodiode.

The second reset circuit RT2 may be coupled between the first high voltage terminal and the second node N2. The second reset circuit RT2 may reset the second sensing circuit P2 and the second charge storage circuit C2 based on the reset signal RX.

The second transmission circuit TT2 may be coupled between the second node N2 and a second floating diffusion node FD2. The second transmission circuit TT2 may reset the second charge storage circuit C2 and transmit the second charges, which are generated from the second sensing circuit P2, to the second charge storage circuit C2, based on the transmission signal TX.

The second charge storage circuit C2 may be coupled between the second floating diffusion node FD2 and the first low voltage terminal. The second charge storage circuit C2 may be a parasitic capacitor.

The second driving circuit DT2 may be coupled between the first high voltage terminal and the second selection circuit ST2. The second driving circuit DT2 may drive a second column line COL2 with the high voltage, which is supplied through the first high voltage terminal, based on a voltage loaded on the second floating diffusion node FD2.

The second selection circuit ST2 may be coupled between the second driving circuit DT2 and the second column line COL2. The second selection circuit ST2 may selectively couple the second driving circuit DT2 to the second column line COL2 based on the selection signal SX. The second selection circuit ST2 may output the second pixel signal VPX2 through the second column line COL2.

Figure 3:
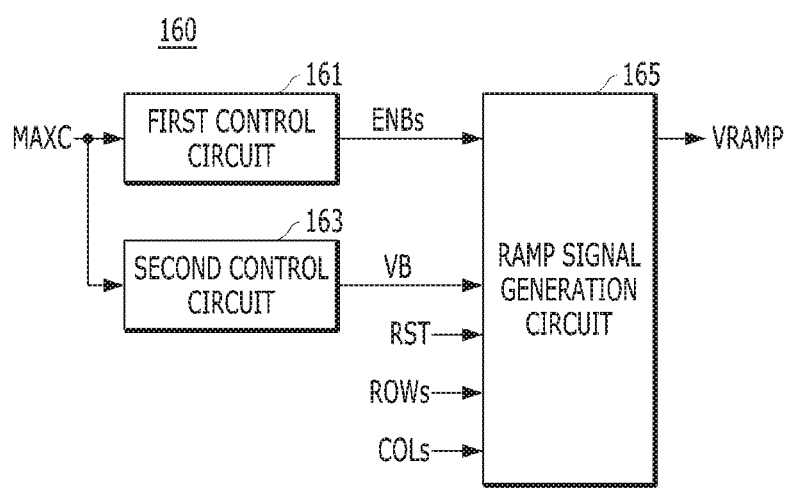
FIG. 3 is a block diagram illustrating a ramp signal generator, such as that illustrated in FIG. 1.

FIG. 3 is a block diagram illustrating the ramp signal generator 160 illustrated in FIG. 1.

Referring to FIG. 3, the ramp signal generator 160 may include a first control circuit 161, a second control circuit 163 and a ramp signal generation circuit 165.

The first control circuit 161 may generate a plurality of enable signals ENBs based on a maximum conversion code value MAXC of A/D conversion code values included in the A/D conversion range. The maximum conversion code value MAXC may be adjusted together as the A/D conversion range is adjusted. The maximum conversion code value MAXC may be determined according to a ratio between the reflected light reflected from the subject 200 and the background light present in the periphery of the subject 200. Although the present embodiment describes an example in which the first control circuit 161 is included in the ramp signal generator 160, the present invention is not limited thereto; the first control circuit 161 may be included in a timing controller (not illustrated) that controls overall operation of the image sensing device 100.

The second control circuit 163 may generate a bias voltage VB based on the maximum conversion code value MAXC. The bias voltage VB may be adjusted according to the maximum conversion code value MAXC. Although the present embodiment describes an example in which the second control circuit 163 is included in the ramp signal generator 160, the present invention is not limited thereto; the second control circuit 163 may be included in the timing controller (not illustrated).

The ramp signal generation circuit 165 may generate the ramp signal VRAMP based on the plurality of enable signals ENBs, the bias voltage VB, a reset signal RST, a plurality of row selection signals ROWs and a plurality of column selection signals COLs. For example, the ramp signal generation circuit 165 may adjust the slope of the ramp signal VRAMP based on the bias voltage VB, fix the swing range of the ramp signal VRAMP based on the plurality of enable signals ENBs, and ramp the ramp signal VRAMP based on the reset signal RST, the plurality of row selection signals ROWs and the plurality of column selection signals COLs. The reset signal RST, the plurality of row selection signals ROWs and the plurality of column selection signals COLs may be generated from the timing controller (not illustrated).

Figure 4:
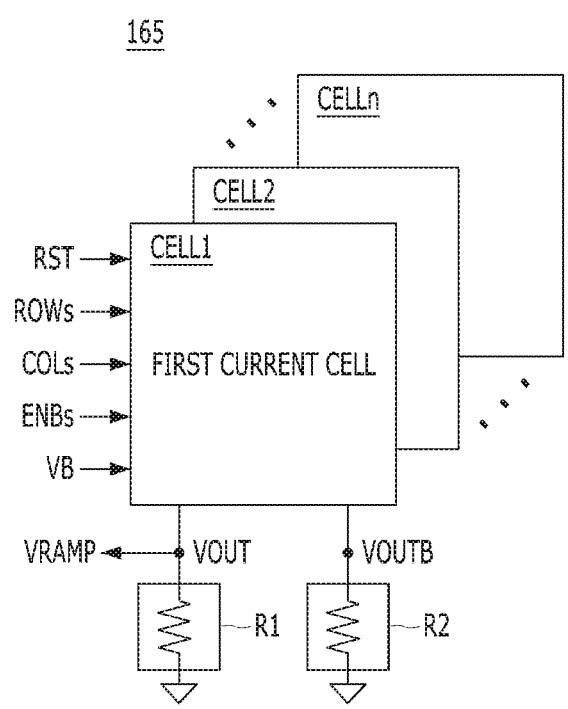
FIG. 4 is a block diagram illustrating a ramp signal generation circuit, such as that illustrated in FIG. 3.

FIG. 4 is a block diagram illustrating the ramp signal generation circuit 165 illustrated in FIG.

Referring to FIG. 4, the ramp signal generation circuit 165 may include a plurality of current cells CELL1 to CELLn, a first current-voltage conversion circuit R1 and a second current-voltage conversion circuit R2.

The total number of current cells CELL1 to CELLn may be adjusted based on the plurality of enable signals ENBs. For example, the number of current cells to be used among the plurality of current cells CELL1 to CELLn may be adjusted according to the A/D conversion range. The current cells used among the plurality of current cells CELL1 to CELLn may be sequentially controlled based on a corresponding row selection signal among the plurality of row selection signals ROWs, a corresponding column selection signal among the plurality of column selection signals COLs and the reset signal RST. For example, when "n" current cells CELL1 to CELLn are sequentially controlled, "a" row selection signals ROW1 to ROWa and "b" column selection signals COL1 to COLb may be required (n=a*b). Herein, "n" is a natural number greater than 2, "a" is a natural number greater than 1, and "b" is a natural number greater than 1. Each of the plurality of current cells CELL1 to CELLn may selectively supply unit current to one of a first output terminal VOUT and a second output terminal VOUTB. The ramp signal VRAMP may be generated through the first output terminal VOUT. For reference, a ramp signal ramping in an opposite direction to the ramp signal VRAMP may be generated through the second output terminal VOUTB. Although the present embodiment describes an example in which the ramp signal VRAMP generated through the first output terminal VOUT is used, the present invention is not limited thereto; the ramp signal generated through the second output terminal VOUTB may be used, depending on design.

The first current-voltage conversion circuit R1 may convert the unit currents, which are supplied from the current cells used among the plurality of current cells CELL1 to CELLn to the first output terminal VOUT, into the ramp signal VRAMP. For example, the first current-voltage conversion circuit R1 may include a resistor coupled between the first output terminal VOUT and a ground voltage terminal.

The second current-voltage conversion circuit R2 may convert the unit currents, which are supplied from the plurality of current cells CELL1 to CELLn to the second output terminal VOUTB, into the ramp signal. For example, the second current-voltage conversion circuit R2 may include a resistor coupled between the second output terminal VOUTB and the ground voltage terminal.

Figure 5:
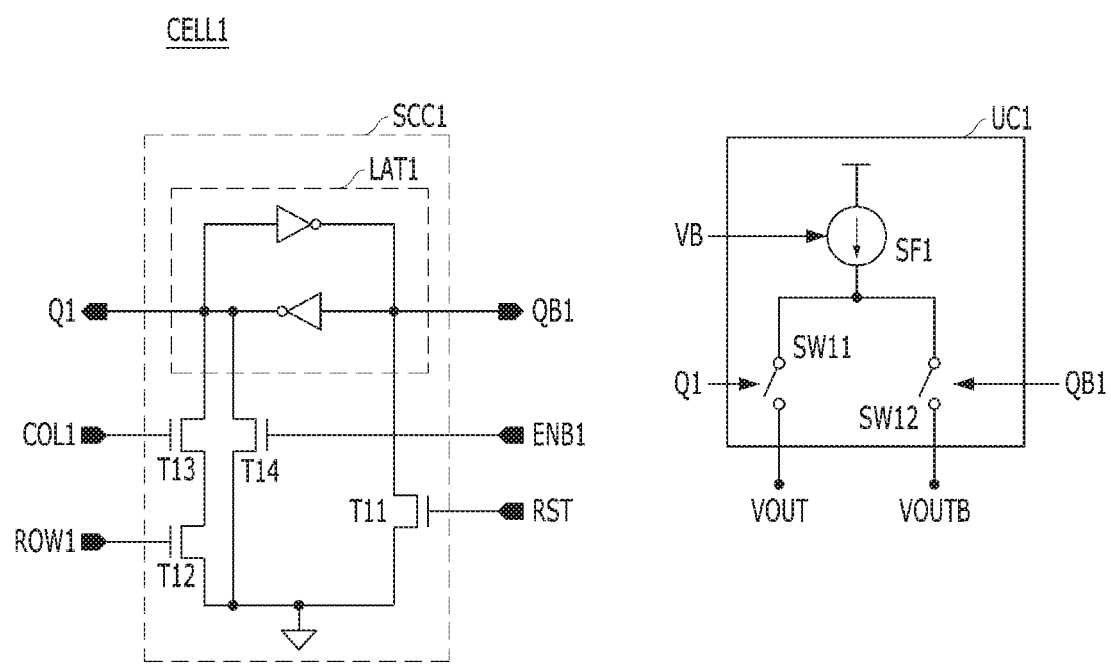
FIG. 5 is a circuit diagram illustrating a first current cell illustrated, such as that illustrated in FIG. 4.

FIG. 5 is a circuit diagram illustrating a first current cell CELL1 illustrated in FIG. 4.

Referring to FIG. 5, the first current cell CELL1 may include a first switch control circuit SCC1 and a first unit current supply circuit UC1.

The first switch control circuit SCC1 may generate a first switch control signal Q1 and a first inverted switch control signal QB1 based on the reset signal RST, a first row selection signal ROW1, the first column selection signal COL1 and a first enable signal ENB1. For example, the first switch control signal Q1 may be activated based on the reset signal RST, may be deactivated based on the first row selection signal ROW1 and the first column selection signal COL1, and may be deactivated based on the first enable signal ENB1. The first inverted switch control signal QB1 may be an inverted signal of the first switch control signal Q1.

The first switch control circuit SCC1 may include a first latch LAT1, a first reset element T11, a first row selection element T12, a first column selection element T13 and a first disable element T14.

The first latch LAT1 may be coupled between a first node and a first inverted node. For example, the first latch LAT1 may latch the first switch control signal Q1 and the first inverted switch control signal QB1, output the first switch control signal Q1 through the first node and output the first inverted switch control signal QB1 through the first inverted node.

The first reset element T11 may be coupled between the first inverted node and a second low voltage terminal. The second low voltage terminal may be the same as or different from the first low voltage terminal. The first reset element T11 may activate the first switch control signal Q1 and deactivate the first inverted switch control signal QB1 based on the reset signal RST. For example, the reset element T11 may include an NMOS transistor having a gate terminal to which the reset signal RST is inputted and a drain terminal and a source terminal coupled between the first inverted node and the second low voltage terminal.

The first row selection element T12 and the first column selection element T13 may be coupled in series between the first node and the second low voltage terminal. When the first row selection element T12 is enabled based on the first row selection signal ROW1, and the first column selection element T13 is enabled based on the first column selection signal COL1, the first switch control signal Q1 may be deactivated, and the first inverted switch control signal QB1 may be activated. Although the present embodiment describes an example in which the first row selection element T12 and the first column selection element T13 are configured, only one of the first row selection element T12 and the first column selection element T13 may be configured, depending on design.

The first disable element T14 may be coupled between the first node and the second low voltage terminal. When the first disable element T14 is enabled based on the first enable signal ENB1, the first switch control signal Q1 may be deactivated, and the first inverted switch control signal QB1 may be activated.

The first unit current supply circuit UC1 may include a first current source SF1, a first switch SW11 and a first inverted switch SW12.

The first current source SF1 may be coupled between a second high voltage terminal and a first common node. The second high voltage terminal may be the same as or different from the first high voltage terminal. The first current source SF1 may generate the unit current based on the bias voltage VB. The amount of the unit current may be adjusted according to the bias voltage VB. The amount of the unit current is related to the slope of the ramp signal VRAMP.

The first switch SW11 may be coupled between the first current source SF1 and the first output terminal VOUT. The first switch SW11 may supply the unit current, which is generated from the first current source SF1, to the first output terminal VOUT based on the first switch control signal Q1.

The first inverted switch SW12 may be coupled between the first current source SF1 and the second output terminal VOUTB. The first inverted switch SW1.2 may supply the unit current, which is generated from the first current source SF1, to the second output terminal VOUTB based on the first inverted switch control signal QB1.

Since second to $n^{th}$ current cells CELL2 to CELLn among the plurality of current cells CELL1 to CELLn may be configured in the same manner as the first current cell CELL1 described above, detailed descriptions thereon will be omitted. However, the second to nth current cells CELL2 to CELLn may be controlled based on respective corresponding row selection signals among the plurality of row selection signals ROWs, respective corresponding column selection signals among the plurality of column selection signals COLs and second to $n^{th}$ enable signals ENB2 to ENBn, respectively, among the plurality of enable signals ENBs.

Hereinafter, an operation of the image sensing device 100 having the above-described configuration is described in accordance with an embodiment.

The image sensing device 100 may operate in the order of reset time, integration time and readout time. For example, during the reset time, the pixel array 150 may be reset. During the integration time, the light emitter 110 may emit the emitted light MS, and the pixel array 150 may receive the incident light RS. In this case, the incident light RS may include the reflected light from which the emitted light MS is reflected back from the subject 200 and the background light that is present in the periphery of the subject 200. During the readout time, the pixel array 150 may generate the plurality of pixel signals VPXs based on the plurality of row control signals CTRLs, the first and second control signals MIXA and MIXB and the incident light RS, the ramp signal generator 160 may generate the ramp signal VRAMP whose slope or ramping time is adjusted according to the use environment, and the signal converter 170 may generate the plurality of digital signals DADCs based on the plurality of pixel signals VPXs and the ramp signal VRAMP. Particularly, the signal converter 170 may generate the plurality of digital signals DADCs according to the A/D conversion range corresponding to the slope or ramping time of the ramp signal VRAMP. During the readout time, the image processor 180 may measure the depth based on the plurality of digital signals DADCs.

Figure 6:
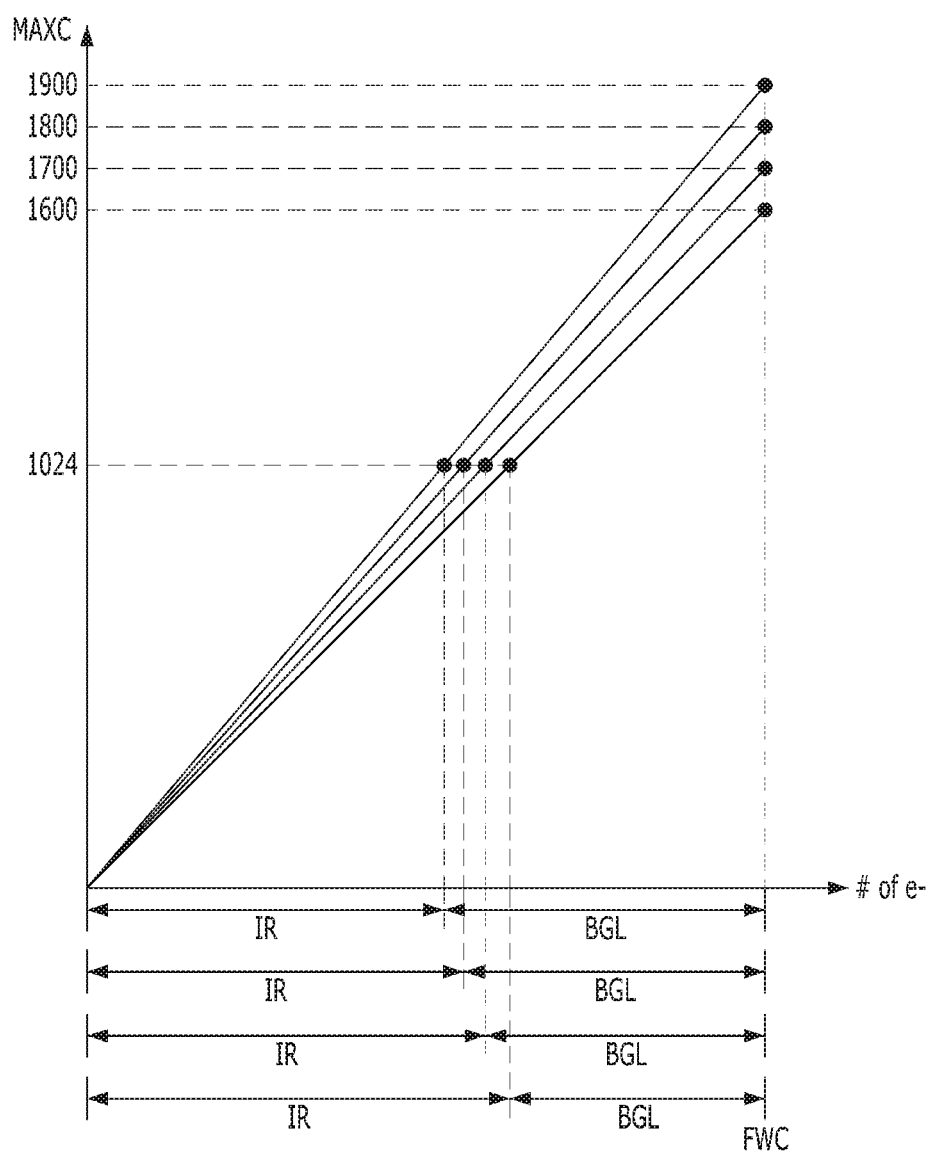
FIGS. 6 to 9 are timing diagrams illustrating an operation of an image sensing device, such as that illustrated in FIG. 1.

FIG. 6 illustrates a graph in which the A/D conversion range is adjusted according to the use environment.

Referring to FIG. 6, the use environment may indicate a ratio between the reflected light and the background light. More specifically, a ratio between a capacity IR allocated to the reflected light and a capacity BGL allocated to the background light in a full well capacity FWC of the first charge storage circuit C1 in the first pixel TAPA may be adjusted according to the use environment. When the ratio between the reflected light and the background light is adjusted, a voltage level allocated to 1 least significant bit (LSB) is adjusted so that the A/D conversion range may also be adjusted. That is, the maximum conversion code value MAXC may be adjusted to any one of "1600", "1700", "1800" and "1900" according to the use environment.

Figure 7:
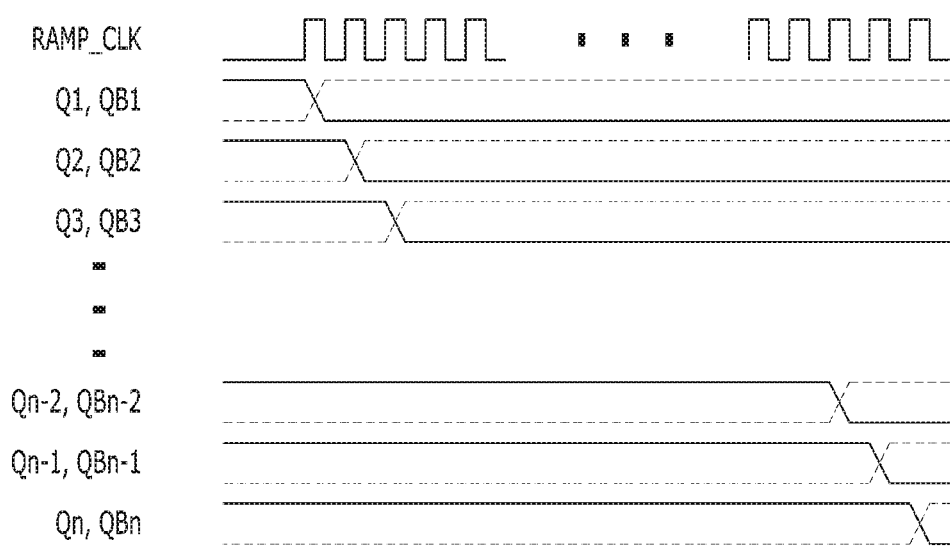
Figure 8:
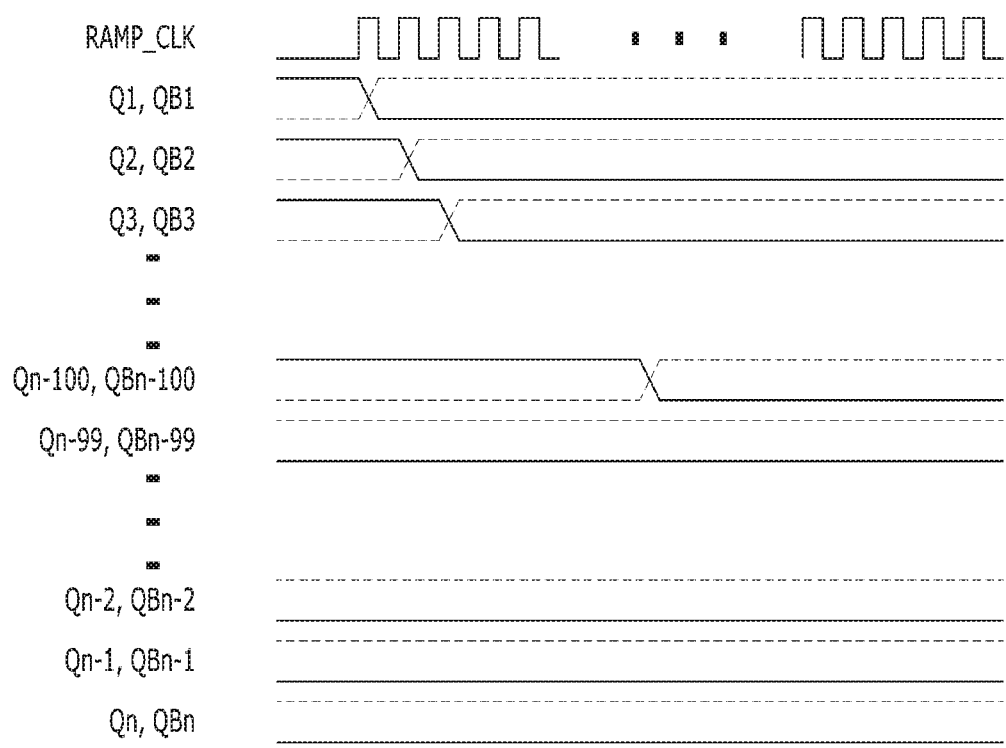

FIG. 7 is a timing diagram illustrating an operation of the ramp signal generator 160 when the maximum conversion code value MAXC is adjusted to "1900", and FIG. 8 is a timing diagram illustrating an operation of the ramp signal generator 160 when the maximum conversion code value MAXC is adjusted to any one of "1600", "1700" and "1800".

Referring to FIG. 7, when the maximum conversion code value MAXC is adjusted to "1900", all of the plurality of current cells CELL1 to CELLn are used. In a state in which the plurality of enable signals ENBs are all deactivated, a plurality of switch control signals Q1 to Qn may be all activated to a logic high level according to the reset signal RST, and then the plurality of switch control signals Q1 to Qn may be sequentially deactivated to a logic low level according to the plurality of row selection signals ROWs and the plurality of column selection signals COLs.

Referring to FIG. 8, when the maximum conversion code value MAXC is adjusted to any one of "1600", "1700" and "1800", some of the plurality of current cells CELL1 to CELLn are used. For example, it is assumed that 100 current cells CELLn-99 to CELLn among the "n" current cells CELL1 to CELLn are not used, and the other "n-100" current cells CELL1 to CELLn-100 are used. The $(n-99)^{th}$ to $n^{th}$ switch control signals Qn-99 to Qn corresponding to the unused "100" current cells CELLn-99 to CELLn may be all deactivated to the logic low level according to the $(n-99)^{th}$ to $n^{th}$ enable signals ENBn-99 to ENBn. On the other hand, since the first to $(n-100)^{th}$ enable signals ENB1 to ENBn-100 corresponding to the used "n-100" current cells CELL1 to CELLn-100 are in a deactivation state, the first to $(n-100)^{th}$ switch control signals Q1 to Qn-100 may be all activated to the logic high level according to the reset signal RST, and then the first to $(n-100)^{th}$ switch control signals Q1 to Qn-100 may be sequentially deactivated to the logic low level according to the plurality of row selection signals ROWs and the plurality of column selection signals COLs.

The unused "100" current cells CELLn-99 to CELLn do not forcibly supply the unit currents to the first output terminal VOUT according to the $(n-99)^{th}$ to $n^{th}$ enable signals ENBn-99 to ENBn. More specifically, the unused "100" current cells CELLn-99 to CELLn may be electrically coupled to the second output terminal VOUTB, thereby supplying the unit currents to the second output terminal VOUTB, and the unused "100" current cells CELLn-99 to CELLn are electrically decoupled from the first output terminal VOUT, thereby having no effect on the first output terminal VOUT. Therefore, a DC offset occurring in the first output terminal VOUT due to the current cells not used when generating the ramp signal VRAMP may be removed, whereby the swing range of the ramp signal VRAMP may not be changed but fixed even though the A/D conversion range is adjusted.

Figure 9:
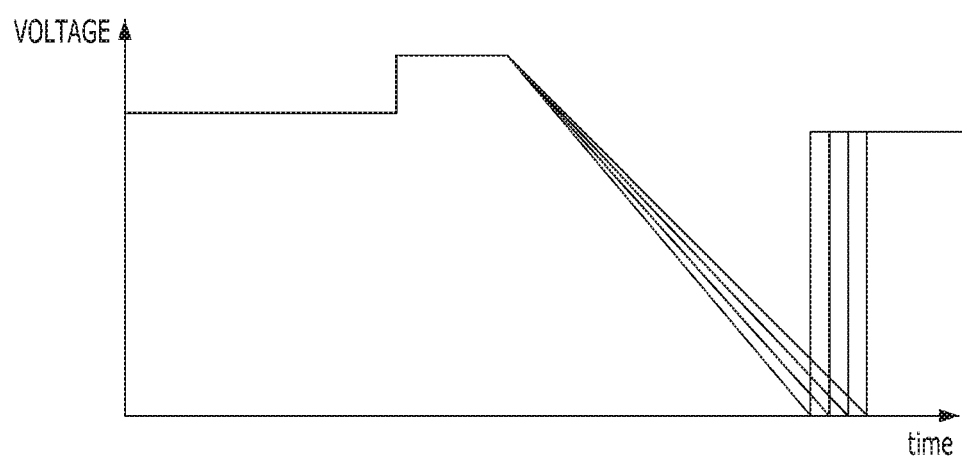

FIG. 9 is a timing diagram illustrating a waveform of the ramp signal VRAMP adjusted according to the use environment.

FIG. 9 illustrates that, even though the A/D conversion range is adjusted according to the use environment, the swing range of the ramp signal VRAMP is unchanged. In other words, as the number of current cells to be used is adjusted together when a voltage level of the bias voltage VB is adjusted so as to adjust the slope of the ramp signal VRAMP, the swing range of the ramp signal VRAMP may be remain fixed. For reference, four different solid lines representing the ramp signal VRAMP may correspond to the four maximum conversion code values MAXC illustrated in FIG. 6, that is, "1600", "1700", "1800" and "1900", respectively.

According to an embodiment of the present disclosure, a ratio between reflected light and background light which is optimized according to the use environment may be provided, and a DC offset may be prevented from occurring in a ramp signal when adjusting an A/D conversion range.

According to an embodiment of the present disclosure, the performance of the image sensing device may be improved by flexibly adjusting an analog to digital (A/D) conversion range according to a use environment or condition when measuring depth information by means of a time-of-flight (ToF) technology.

While the present disclosure has been illustrated and described with respect to specific embodiments, various changes and modifications may be made as those skilled in the art will recognize in light of the present disclosure. Thus, none of the disclosed embodiments nor any particular detail is intended to be restrictive. The present invention encompasses all variations that fall within the scope of the claims.

What is claimed is:

1. An image sensing device comprising:
    a plurality of current cells whose total number to be used is adjusted based on a plurality of enable signals, and which are sequentially controlled based on a reset signal and a plurality of selection signals;
    a current-voltage conversion circuit suitable for converting a plurality of unit currents, which are supplied from current cells used among the plurality of current cells, into a ramp signal; and
    a first control circuit suitable for generating the plurality of enable signals based on a maximum conversion code value corresponding to a slope of the ramp signal.

2. The image sensing device of claim 1, wherein the maximum conversion code value is determined according to a ratio between reflected light that is reflected from a subject and background light that is present in a periphery of the subject.

3. The image sensing device of claim 1, wherein at least one current cell that is not used among the plurality of current cells is electrically decoupled from an output terminal of the ramp signal.

4. The image sensing device of claim 1, wherein each of the plurality of current cells includes:
    a switch control circuit suitable for generating a switch control signal that is activated based on the reset signal, deactivated based on at least one corresponding selection signal among the plurality of selection signals, and deactivated based on a corresponding enable signal among the plurality of enable signals; and
    a unit current supply circuit suitable for selectively supplying the unit currents to an output terminal of the ramp signal based on the switch control signal.

5. The image sensing device of claim 4, wherein the switch control circuit includes:
    a latch coupled between first and second nodes, and suitable for latching the switch control signal;
    a reset element coupled between the first node and a predetermined voltage terminal, and suitable for activating the switch control signal based on the reset signal;
    at least one selection element coupled between the second node and the predetermined voltage terminal, and suitable for deactivating the switch control signal based on the at least one selection signal; and
    a disable element coupled between the second node and the predetermined voltage terminal, and suitable for deactivating the switch control signal based on the corresponding enable signal.

6. The image sensing device of claim 4,
    wherein the unit current supply circuit adjusts an amount of the unit currents based on a bias voltage, and
    wherein a voltage level of the bias voltage is adjusted corresponding to the maximum conversion code value.

7. The image sensing device of claim 1,
    further comprising a second control circuit suitable for generating a bias voltage whose voltage level is adjusted based on the maximum conversion code value, and
    wherein each of the plurality of current cells adjusts an amount of the unit currents based on the bias voltage.

8. An image sensing device comprising:
    a pixel array suitable for generating a plurality of pixel signals based on incident light;
    a signal converter suitable for generating a plurality of digital signals based on the plurality of pixel signals and a ramp signal; and
    a ramp signal generator including a plurality of current cells, and suitable for generating the ramp signal by adjusting the total number of current cells to be used among the plurality of current cells, based on a maximum conversion code value corresponding to a slope of the ramp signal and sequentially controlling the current cells to be used, based on a plurality of selection signals and a reset signal.

9. The image sensing device of claim 8, wherein the maximum conversion code value is determined according to a ratio between reflected light that is reflected from a subject and background light that is present in a periphery of the subject, the reflected light and the background light being included in the incident light.

10. The image sensing device of claim 8, wherein at least one current cell which is not used among the plurality of current cells is electrically decoupled from an output terminal of the ramp signal.

11. The image sensing device of claim 8, wherein the ramp signal generator adjusts the slope of the ramp signal based on the maximum conversion code value, a swing range of the ramp signal being fixed.

12. The image sensing device of claim 11, wherein the signal converter adjusts an analog to digital (A/D) conversion range according to the slope of the ramp signal, and generates the plurality of digital signals according to the A/D conversion range.

13. The image sensing device of claim 8, wherein the ramp signal generator includes:
    the plurality of current cells whose total number to be used is adjusted based on a plurality of enable signals, and which are sequentially controlled based on the plurality of selection signals and the reset signal;

a current-voltage conversion circuit suitable for converting a plurality of unit currents, which are supplied from current cells used among the plurality of current cells, into the ramp signal; and a first control circuit suitable for generating the plurality of enable signals based on the maximum conversion code value.

14. The image sensing device of claim 13, wherein each of the plurality of current cells includes:

a switch control circuit suitable for generating a switch control signal that is activated based on the reset signal, deactivated based on at least one corresponding selection signal among the plurality of selection signals, and deactivated based on a corresponding enable signal among the plurality of enable signals; and a unit current supply circuit suitable for selectively supplying the unit currents to an output terminal of the ramp signal based on the switch control signal.

15. The image sensing device of claim 14, wherein the switch control circuit includes:

a latch coupled between first and second nodes, and suitable for latching the switch control signal;

a reset element coupled between the first node and a predetermined voltage terminal, and suitable for activating the switch control signal based on the reset signal;

at least one selection element coupled between the second node and the predetermined voltage terminal, and suitable for deactivating the switch control signal based on the at least one selection signal; and a disable element coupled between the second node and the predetermined voltage terminal, and suitable for deactivating the switch control signal based on the corresponding enable signal.

16. The image sensing device of claim 14, wherein the unit current supply circuit adjusts an amount of the unit currents based on a bias voltage, and wherein a voltage level of the bias voltage is adjusted corresponding to the maximum conversion code value.

17. The image sensing device of claim 13, wherein the ramp signal generator further includes a second control circuit suitable for generating a bias voltage whose voltage level is adjusted, based on the maximum conversion code value, and wherein each of the plurality of current cells adjusts an amount of the unit currents based on the bias voltage.

18. An operating method of an image sensing device, comprising:

emitting emitted light to a subject;

receiving background light and reflected light, which is reflected from the subject;

generating a digital signal according to an analog to digital (A/D) conversion range corresponding to a slope of a ramp signal, based on the ramp signal whose slope is adjusted according to a use environment indicating a ratio between the reflected light and the background light and a pixel signal outputted from a pixel array; and measuring a depth from the subject based on the digital signal.

19. The operating method of claim 18, wherein the ramp signal is generated by sequentially controlling current cells to be used among a plurality of current cells.

20. The operating method of claim 19, wherein at least one current cell which is not used among the plurality of current cells is electrically decoupled from an output terminal of the ramp signal.

* * * * *